(12) United States Patent
Lee et al.

(10) Patent No.: US 11,754,517 B2
(45) Date of Patent: Sep. 12, 2023

(54) INSPECTION APPARATUS FOR INSPECTING SEMICONDUCTOR DEVICES USING CHARGED PARTICLES

(71) Applicant: Samsung Electronics Co., Ltd., Suwon-si (KR)

(72) Inventors: Suyoung Lee, Seongnam-si (KR); Jongmin Kim, Seoul (KR); Ilsuk Park, Hwaseong-si (KR); Kwangil Shin, Suwon-si (KR); Chungsam Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 17/175,173

(22) Filed: Feb. 12, 2021

(65) Prior Publication Data
US 2021/0333225 A1 Oct. 28, 2021

(30) Foreign Application Priority Data
Apr. 28, 2020 (KR) .................... 10-2020-0051230

(51) Int. Cl.
*G06K 9/00* (2022.01)
*G01N 23/225* (2018.01)
(Continued)

(52) U.S. Cl.
CPC ......... *G01N 23/225* (2013.01); *G01N 23/221* (2013.01); *G06T 7/001* (2013.01);
(Continued)

(58) Field of Classification Search
CPC .............. G01N 23/225; G01N 23/221; G01N 2223/401; G01N 2223/6116;
(Continued)

(56) References Cited

U.S. PATENT DOCUMENTS 4,902,967 A 2/1990 Flesner
6,252,412 B1 * 6/2001 Talbot .................. G06T 7/0004
324/762.05

(Continued)

FOREIGN PATENT DOCUMENTS

JP 6343508 B2 6/2018
KR 20150060748 A 6/2015

*Primary Examiner* — Samir A Ahmed
(74) *Attorney, Agent, or Firm* — Muir Patent Law, PLLC

(57) ABSTRACT

An inspection apparatus and a method of inspecting a semiconductor device are disclosed. The inspection apparatus includes a stage on which a semiconductor device is positioned, a first light source irradiating a high-frequency light onto an inspection area of the semiconductor device to reduce a potential barrier of a PN junction in the semiconductor device, a beam scanner arranged over the semiconductor device and irradiating a charged particle beam onto the inspection area of the semiconductor device to generate secondary electrons, and a defect detector generating a detection image corresponding to the inspection area and detecting, based on a voltage contrast between a reference image and a plurality of detection images, a defect image indicating a defect in the semiconductor device from among the plurality of detection images.

16 Claims, 10 Drawing Sheets

(51) Int. Cl.
*G01N 23/221* (2006.01)
*G06T 7/00* (2017.01)

(52) U.S. Cl.
CPC .......... *G01N 2223/401* (2013.01); *G01N 2223/6116* (2013.01); *G01N 2223/6462* (2013.01); *G06T 2207/30148* (2013.01)

(58) Field of Classification Search
CPC ....... G01N 2223/6462; G01N 23/2251; G01N 21/9515; G01N 2021/8887; G06T 7/001; G06T 2207/30148; H01L 22/14; H01L 22/20; H01L 22/12; G01R 31/00
See application file for complete search history.

(56) References Cited

U.S. PATENT DOCUMENTS

| | | |
|---|---|---|
| 3,026,501 A1 | 9/2011 | Williamson et al. |
| 9,165,742 B1 | 10/2015 | Simmons et al. |
| 9,741,536 B2 | 8/2017 | Lee et al. |
| 9,905,394 B1 | 2/2018 | Bhattiprolu et al. |
| 10,014,151 B2 | 7/2018 | Imai et al. |
| 2007/0187600 A1* | 8/2007 | Nagahama .............. H01J 37/28 250/310 |
| 2019/0227119 A1 | 7/2019 | Vickers et al. |
| 2020/0006031 A1* | 1/2020 | Izumi ................. H01J 37/1472 |

* cited by examiner

FIG. 8

| INSPECTION MODE | Ⓐ Ⓑ Ⓒ     Ⓓ Ⓔ Ⓕ | DWELL TIME |
|---|---|---|
| NORMAL MODE | | A |
| BOOSTING MODE 1 | | A |
| BOOSTING MODE 2 | | A/b (b>1) |
| BOOSTING MODE 3 | | A/b (b>1) |

INSPECTION APPARATUS FOR INSPECTING SEMICONDUCTOR DEVICES USING CHARGED PARTICLES

CROSS-REFERENCE TO RELATED APPLICATIONS

This application claims priority under 35 U.S.C § 119 to Korean Patent Application No. 10-2020-0051230 filed on Apr. 28, 2020 in the Korean Intellectual Property Office, the contents of which are incorporated by reference herein in its entirety.

BACKGROUND

1. Field

Example embodiments relate to an inspection apparatus for inspecting semiconductor devices and a method of inspecting semiconductor devices using the same, and more particularly, to an inspection apparatus for inspecting semiconductor devices by using charged particles and a method of inspecting the semiconductor devices using the same.

2. Description of the Related Art

Due to the high integration degree of recent semiconductor devices, a contact area and a critical dimension of semiconductor devices have been reduced to be smaller than a threshold wavelength of an inspection apparatus. As a result, this has made the inspection of semiconductor devices using an optical inspection apparatus more difficult.

For those reasons, a charged particle inspection apparatus using a charged particle beam has been widely used for the inspection of nano-scaled defects of semiconductor devices in place of the optical inspection apparatus due to the relatively higher resolution degree of the charged particle inspection apparatus when compared to that of the optical inspection apparatus.

According to the conventional charged particle inspection apparatus, a charged particle beam is irradiated onto the semiconductor device and then secondary electrons generated from the semiconductor device in response to the charged particle beam may be detected. A plurality of detection images may be obtained according to the detection voltages of the secondary electrons and each of the detection images is contrasted with a reference image to determine a difference brightness (voltage contrast inspection). Thus, a defect and the position of the defect in the semiconductor device are determined by the voltage contrast inspection.

However, the size of the inspection area is so small, below about 2 nm, that the charged particle inspection apparatus and the beam scanner for irradiating the charged particle beam requires at least a dwell time for detecting a quantity of the secondary electrons sufficient for generating the detection image. For those reasons, the inspection efficiency/speed of the charged particle inspection apparatus is much smaller/slower than that of the optical inspection apparatus.

As the pattern structures of the recent semiconductor devices have become smaller and smaller, there has been a trend that the charged particle inspection apparatus is much more widely used instead of the optical inspection apparatus. However, it is known that the inspection speed of the charged particle inspection apparatus is below 1% of that of the optical inspection apparatus.

SUMMARY

Example embodiments of the present inventive concept provide an inspection apparatus for inspecting a semiconductor device by a voltage contrast in which the second electrons are sufficiently boosted and the dwell time of the beam scanner is sufficiently reduced.

Other example embodiments of the present inventive concept provide a method of inspecting a semiconductor device by the above inspection apparatus.

According to exemplary embodiments of the inventive concept, there is provided an inspection apparatus including a stage on which a semiconductor device may be positioned, the semiconductor device including a plurality of PMOS devices and a plurality of NMOS devices, a first light source irradiating a high-frequency light onto an inspection area of the semiconductor device to reduce a potential barrier of a PN junction in the semiconductor device, a beam scanner arranged over the semiconductor device and irradiating a charged particle beam onto the inspection area of the semiconductor device such that secondary electrons are generated from the inspection area in response to the charged particle beam, and a defect detector generating a detection image corresponding to the inspection area in response to a voltage of the secondary electrons and detecting, based on a voltage contrast between a reference image and a plurality of detection images, a defect image indicating a defect in the semiconductor device from among the plurality of detection images.

According to other exemplary embodiments of the inventive concept, there is provided a method of inspecting a semiconductor device. A semiconductor device may be secured onto a stage, the semiconductor device including a plurality of NMOS devices and PMOS devices. A high-frequency light may be irradiated onto a plurality of inspection areas of the semiconductor device to reduce a potential barrier of a PN junction in the semiconductor device. A low-frequency light having energy greater than a band gap energy of the PN junction may be irradiated onto the plurality of inspection areas to generate a photo electromotive force at the PN junction in the semiconductor device. Then, a charged particle beam may be irradiated onto the plurality of inspection areas to generate a plurality of secondary electrons from the semiconductor device. The secondary electrons boosted by the photo electromotive force may be detected to thereby obtain a plurality of detection images corresponding to the plurality of inspection areas of the semiconductor device. The detection images may be contrasted with a reference image and then the detection image satisfying a defect criterion may be detected as a defect image indicating a defect in the respective inspection area of the semiconductor device.

According to example embodiments of the present inventive concept, the high-frequency light may be irradiated onto the semiconductor device for reducing the potential barrier of the PN junction and the low-frequency light having energy greater than a band gap energy of the PN junction may be irradiated onto the semiconductor device for generating the photo electromotive force in the PN junction. When the charged particle beam is irradiated onto the semiconductor device and the secondary electrons are generated from the well region of the semiconductor device, a larger quantity of the secondary electrons E having a boosted energy may be detected by the defect detector.

The detection images may be generated from the boosted secondary electrons for a shorter dwell time of the defect detector with sufficiently high contrast. Thus, a defect of the semiconductor device may be detected by the voltage contrast inspection regardless of the NMOS device and the PMOS device with sufficiently high accuracy and efficiency. Due to the dwell time reduction of the defect detector and high voltage contrast of the detection images, the inspection process with respect to a whole surface of the wafer can be conducted with high accuracy.

BRIEF DESCRIPTION OF THE DRAWINGS

These and other features of the inventive concept will become more apparent by describing in detail exemplary embodiments thereof with reference to the accompanying drawings of which:

FIG. 8 is a table showing the detection images of the inspection areas of the semiconductor device shown in FIG. 7;

DETAILED DESCRIPTION OF THE EMBODIMENTS

Figure 1:
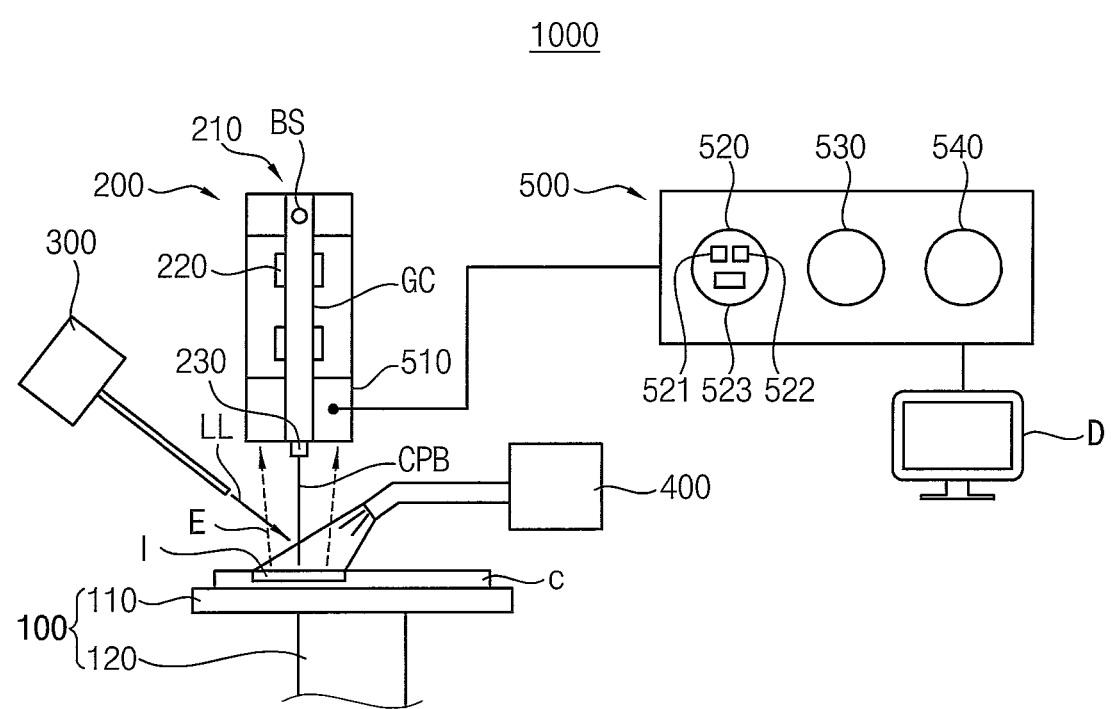
FIG. 1 is a structural view illustrating an inspection apparatus for inspecting semiconductor devices by using a charged particle beam in accordance with an example embodiment of the present inventive concept.

Reference will now be made to example embodiments, which are illustrated in the accompanying drawings, wherein like reference numerals may refer to like components throughout.

Figure 2:
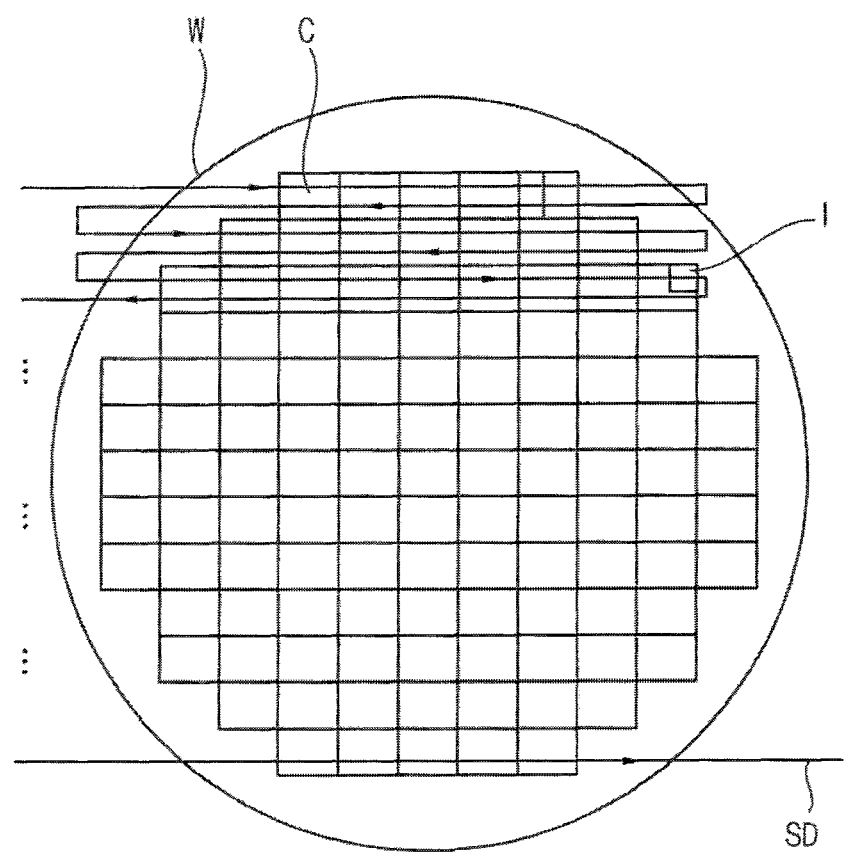
FIG. 2 is a plan view illustrating a plan view illustrating a scan direction of the charged particle beam on a wafer in the inspection apparatus shown in FIG. 1.

FIG. 1 is a structural view illustrating an inspection apparatus for inspecting semiconductor devices by using a charged particle beam in accordance with an example embodiment of the present inventive concept. FIG. 2 is a plan view illustrating a scan direction of the charged particle beam on a wafer in the inspection apparatus shown in FIG. 1.

Referring to FIG. 1, an inspection apparatus 1000 in accordance with an example embodiment of the present inventive concept may include a stage 100 on which a semiconductor device C may be positioned, a beam scanner 200 arranged over the stage and irradiating a charged particle beam CPB onto the semiconductor device C across an inspection area I such that secondary electrons E may be generated from the inspection area I in response to the charged particle beam CPB, a first light source 300 irradiating a high-frequency light HL to the inspection area I, a second light source 400 irradiating a low-frequency light LL to the inspection area I, and a defect detector 500 generating a detection image corresponding to the inspection area I in response to a voltage of the detected secondary electrons E and detecting a defect image indicating a defect in the semiconductor device C from among the detection images by a voltage contrast inspection. As used herein, a semiconductor device may refer to a device such as a semiconductor chip (e.g., memory chip and/or logic chip formed on a die) or a stack of semiconductor chips. As illustrated, for example, in FIG. 2, a plurality of semiconductor devices C are arranged on a wafer.

In an example embodiment, the stage 100 may be arranged in an inspection chamber (not shown) and the semiconductor device C under inspection may be mounted onto the stage 100. Thus, the semiconductor device C may be secured to the stage 100 in the inspection process. For example, the stage 100 may include a chuck 110 onto which the semiconductor device C may be secured and a position controller 120 connected to the chuck 110 and controlling the position of the semiconductor device C by rotating and tilting the chuck 110.

The semiconductor device C, for example, may include a chip on a wafer W. The wafer W may be arranged on the chuck 110 and a plurality of semiconductor devices C may be arranged on the wafer W. The inspection process may be sequentially conducted on each semiconductor device C in a scan direction SD. The chuck 110 may include an electrostatic chuck (ESC) onto which the wafer W may be secured by an electrostatic force.

For example, the position controller 120 may include a support column supporting the chuck 110, a linear driver for linearly moving the support column in three dimensional directions, a rotating driver for rotating the support column with respect to a rotating axis and a tilting driver for tilting the chuck 110 by an angle with respect to a horizontal surface of the support column.

The position controller 120 may control the chuck 110 to move and to locate at a position to which the charged particle beam CPB, the high-frequency light HL and the low-frequency light LL may be simultaneously focused onto an inspection area I of the semiconductor device C in view of the positions of the beam scanner 200, the first light source 300 and the second light source 400.

In contrast, the beam scanner 200, the first light source 300 and the second light source 400 may be individually controlled in such a way that the charged particle beam CPB, the high-frequency light HL and the low-frequency light LL may be focused onto the inspection area I of the semiconductor device C, respectively. Particularly, the chuck 110, the first light source 300 and the second light source 400 may be individually controlled to be focused to a focus point of the beam scanner 200, while the beam scanner 200 may stay stationary at its original position. Thus, the charged particle beam CPB, the high-frequency light HL and the low-frequency light LL may be focused onto the inspection area I of the semiconductor device C.

When the inspection process of the semiconductor device C is initiated, the beam scanner 200, the first light source 300 and the second light source 400 may move along the scan direction SD over the wafer W by a unit of the inspection area I. A whole surface of the wafer W may be inspected by the inspection area I in the scan direction SD.

The wafer W may include a plurality of semiconductor devices C and the inspection process may be repeated for each of the semiconductor devices C on the wafer W according to a size of the inspection area I. For example, when the inspection area I is set to be about 10% of the whole size of an individual semiconductor device C, the inspection process may be repeated 10 times for each individual semiconductor device C.

Thus, the size of the inspection area I may be varied according to the characteristics of the semiconductor device C, the characteristics of the inspection apparatus 1000 and the requirements of the inspection process. In the present example embodiment, the inspection area I may be set to be a square-shaped pixel having a lateral length of about 1 nanometer or a few nanometers to a few tens of nanometers.

The semiconductor device C may include a single semiconductor chip or a group of semiconductor chips that may be stacked on the wafer W and the configurations of the beam scanner 200 may be varied in accordance with the single chip or the group of chips.

The semiconductor device C may include various structures according to the step of the semiconductor manufacturing processes and the inspection process to the semiconductor device C may be conducted as an in-process inspection. For example, the semiconductor device C may include an in-process device in which a direct contact (DC) structure in contact with a drain electrode may be provided or a buried contact (BC) structure in contact with a source electrode as well as the DC structure may be provided. Otherwise, the semiconductor device C may include an in-process device in which metal wirings may be arranged on insulation interlayers as well as the DC structure and the BC structure.

Particularly, the semiconductor device C may include a CMOS device in which a plurality of NMOS devices and a plurality of PMOS devices are arranged. However, the semiconductor device C may also include a plurality of NMOS devices or a plurality of PMOS devices.

In an example embodiment, the beam scanner 200 may be arranged over the stage 100 and may irradiate the charged particle beam CPB onto the inspection area I of the semiconductor device C. The secondary electrons E may be generated from the inspection area I in response to the charged particle beam CPB. Preferably, the beam scanner 200 may be positioned over the stage 100 in such a configuration that the charged particle beam CPB may be vertically irradiated onto the semiconductor device C and the secondary electrons E may be diffused toward the beam scanner 200 around which an electron detector 510 of the defect detector 500 may be arranged.

For example, the beam scanner 200 may include a beam generator 210 generating the charged particle beam CPB from beam source materials, a deflector 220 arranged around the beam generator 210 and controlling a path of the charged particle beam CPB toward the semiconductor device C and an illuminator 230 focusing the charged particle beam CPB onto the inspection area I.

The beam generator 210 may include a beam source BS generating an electron beam or an ion beam as the charged particle beam CPB and a guide chamber GC through which the charged particle beam CPB may be guided toward the inspection area I from the beam source BS. The deflector 220 may be arranged on a side of the guide chamber GC and may control the charged particle beam CPB to travel toward the semiconductor device C by changing an intensity of an electric field and a magnetic field. The illuminator 230 may be positioned at an end portion of the guide chamber GC and may irradiate the charged particle beam CPB onto the inspection area I. The illuminator 230 may include, for example, a beam projector (not shown) for projecting the charged particle beam CPB to the semiconductor device C, a focus controller (not shown) for controlling a focus point of the charged particle beam CPB and a gap controller (not shown) for controlling a gap distance between the semiconductor device C and the beam projector.

For example, the charged particle beam CPB may include an electron beam. However, the charged particle beam CPB may also include an ion beam according to the characteristics of the semiconductor device C and the requirements of the inspection process.

In the present example embodiment, a single beam scanner 200 may be provided with the inspection apparatus 1000. As illustrated in FIG. 2, the wafer W may include a plurality of semiconductor devices C. Each of the plurality of semiconductor devices C may include a plurality of inspection areas I. The single beam scanner 200 may move in a scan direction SD across the plurality of inspection areas I until each of the plurality areas I, and hence the plurality of semiconductor devices C, are inspected. With respect to each individual semiconductor device C, the beam scanner 200 may dwell for a preset time (referred to as dwell time) over each inspection area I and the charged particle beam CPB may irradiate each inspection area I for the dwell time. Thus, all of the inspection areas I of an individual semiconductor device C may be sequentially irradiated by the beam scanner 200 one by one along the scan direction SD. Thus, an overall inspection time for inspecting a semiconductor device C may be determined as the number of the inspection areas I times the dwell time.

In a modified example embodiment, a plurality of charge particle beams CPB may be simultaneously irradiated on a group of the inspection areas I for reducing the overall inspection time. In such a case, a plurality of independent inspection processes may be simultaneously conducted in the inspection apparatus 1000.

Figure 3:
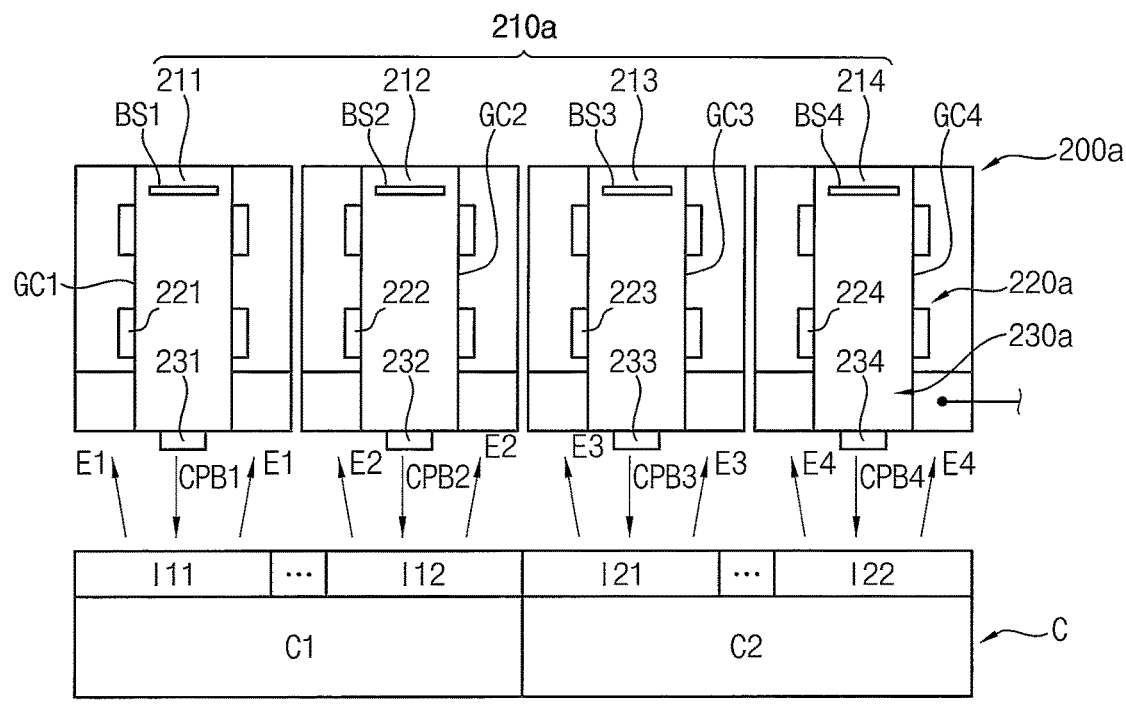
FIG. 3 is a structural view illustrating a first modification of the beam scanner of the inspection apparatus shown in FIG. 1.

FIG. 3 is a structural view illustrating a first modification of the beam scanner of the inspection apparatus shown in FIG. 1.

Referring to FIG. 3, a plurality of beam scanners 200 may be arranged over a single semiconductor device C in such a configuration that each of the beam scanners 200 individually corresponds to an inspection area I and a plurality of charged particle beams CPB may simultaneously irradiate a respective inspection area I independently from one another.

For example, a first modification of the beam scanner (hereinafter, referred to as first modified scanner, 200a) may include a beam generating group 210a including a plurality of beam generators 211 to 214 for individually generating a plurality of charged particle beams CPB, respectively, a deflector group 220a having a plurality of deflectors 221 to 224 individually controlling the paths of the charged particle beams CPB toward a respective inspection area I and an illuminator group 230a including a plurality of illuminators 231 to 234 for irradiating charged particle beams toward the respective inspection area I.

For example, first to fourth beam generators 211 to 214 may be arranged over first to fourth inspection areas I11, I12, I21 and I22, respectively, and the first to fourth beam generators 211 to 214 may include their own beam sources S1 to S4 and guide chambers GC1 to GC4. First to fourth deflectors 221 to 224 may be arranged on a side of the first to fourth guide chambers GC1 to GC4, respectively, and first to fourth illuminators 231 to 234 may be arranged at an end portion of the first to fourth guide chambers GC1 to GC4, respectively.

A first semiconductor device C1 may include first inspection area I11 and second inspection area I12. A second semiconductor device may include third inspection area I21 and fourth inspection area I22. A first charged particle split beam CPB1 may be irradiated onto the first inspection area I11 through the first illuminator 231 and a second charged particle split beam CPB2 may be irradiated onto the second inspection area I12 through the second illuminator 232. A third charged particle split beam CPB3 may be irradiated onto the third inspection area I21 through the third illuminator 233 and a fourth charged particle split beam CPB4 may be irradiated onto the fourth inspection area I22 through the fourth illuminator 234.

In such a case, each of the illuminators 231 to 234 may be sufficiently spaced apart from one another in such a configuration that the secondary electrons E generated from each inspection area I may be individually detected by the defect detector 500 without any substantial interference among the second electrons E generated from neighboring inspection areas I.

For example, the first and the second illuminators 231 and 232 may be sufficiently spaced apart from each other in such a way that the interference between first and second groups of the secondary electrons E1 and E2 generated from the first and the second inspection areas I11 and I12 may be sufficiently prevented or minimized. In addition, the first and the second inspection areas I11 and I12 may be set spaced apart from each other in correspondence to the first and the second illuminators 231 and 232.

Therefore, when the first and the second charged particle beams CPB1 and CPB2 are simultaneously irradiated onto the first and the second inspection areas I11 and I12, respectively, the first group of the secondary electrons E1 and the second group of the secondary electrons E2 may be independently detected by the defect detector 500.

In the same way, the third and the fourth illuminators 233 and 234 may be sufficiently spaced apart from each other in such a way that the interference between third and fourth groups of the secondary electrons E3 and E4 generated from the third and the fourth inspection areas I21 and I22 may be sufficiently prevented or minimized. In addition, the third and the fourth inspection areas I21 and I22 may also be set spaced apart from each other in correspondence to the third and the fourth illuminators 233 and 234.

Therefore, when the third charged particle split beam CPB3 and the fourth charged particle split beam CPB4 are simultaneously irradiated onto the third inspection area I21 and the fourth inspection area I22, the third group of the secondary electrons E3 and the fourth group of the secondary electrons E4 may be independently detected by the defect detector 500.

Accordingly, four charged particle beams CPB1 to CPB4 may be simultaneously irradiated onto four inspection areas, respectively, by the first modified scanner 200a and four groups of the secondary electrons E1 to E4 may be individually detected independently from one another. Thus, four inspection processes may be simultaneously conducted, and an overall inspection time of the inspection process may be reduced to quarter times.

Particularly, the plurality of inspection areas I may be arranged on the same semiconductor device C or on different semiconductor devices C. When a plurality of semiconductor devices C are arranged on the wafer W and the inspection process is conducted on all of the semiconductor devices C on the wafer W, a single semiconductor device C (e.g., a plurality of chips) may include a single inspection area I or a plurality of inspection areas according to the arrangements of the semiconductor devices on the wafer W and the size of the inspection area I. In the present example embodiment, a first semiconductor device C1 and a second semiconductor device C2 may be arranged on the wafer W and the first and the second inspection areas I11 and IZI defined on the first semiconductor device C1 and the third and the fourth inspection areas I21 and I22 may be defined on the second semiconductor device C2. Thus, a pair of the semiconductor devices C1 and C2 may be simultaneously inspected in the inspection apparatus 1000 by using the first modified beam scanner 200a.

While the present example embodiment discloses that 4 beam scanners 200 may be simultaneously conducted in the inspection apparatus 1000, more or less beam scanners 200 may also be provided with the inspection apparatus 1000 according to the inspection efficiency and the characteristics of the inspection apparatus 1000. The number of the inspection areas I may also be varied in relation with the number of the beam scanners 200.

Figure 4:
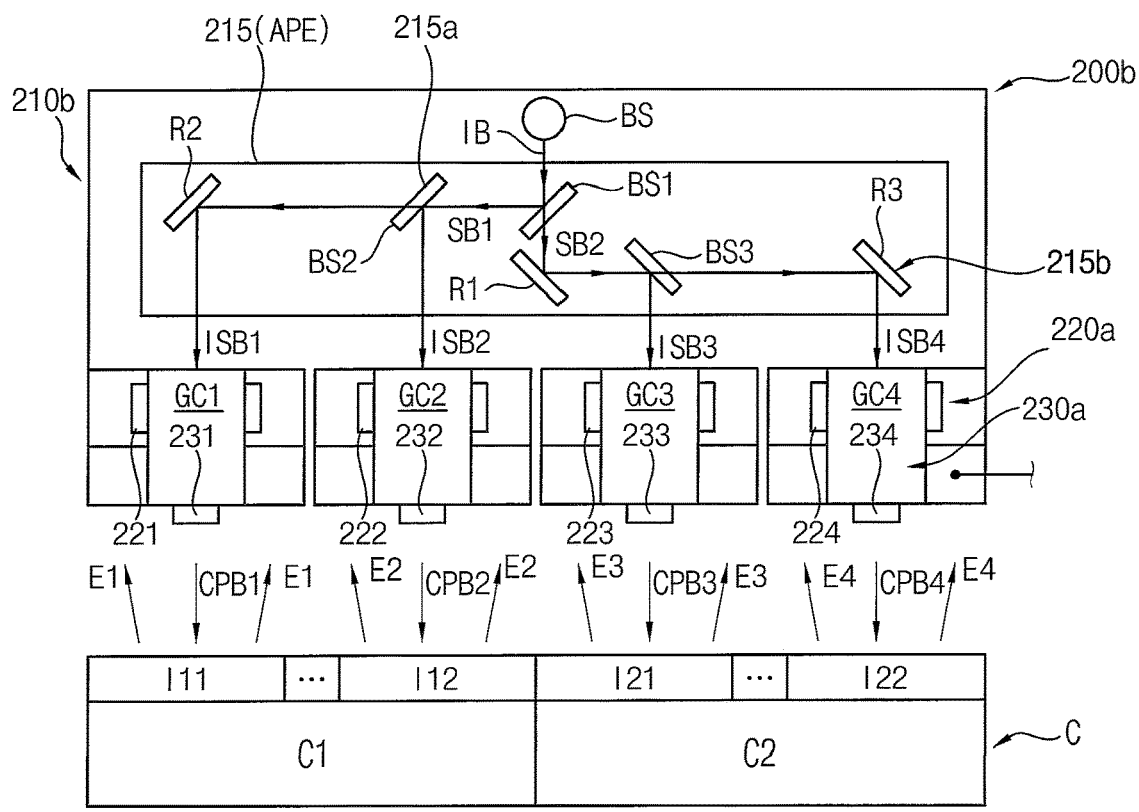
FIG. 4 is a structural view illustrating a second modification of the beam scanner of the inspection apparatus shown in FIG. 1.

FIG. 4 is a structural view illustrating a second modification of the beam scanner of the inspection apparatus shown in FIG. 1. In FIG. 4, the second modification of the beam scanner 200b may generate a single initial beam IB that is split into a multi-beam irradiated onto a plurality of inspection areas I of the semiconductor device C.

Referring to FIG. 4, a second modification of the beam scanner (hereinafter, referred to as second modified scanner, 200b) may include a multi-beam generator 210b for generating a plurality of inspection beams ISB1 to ISB4, the deflector group 220a having a plurality of deflectors 221 to 224 and individually controlling the paths of the inspection beams ISB1 to ISB4 toward the respective inspection area I and the illuminator group 230a including a plurality of illuminators 231 to 234 for irradiating the deflected inspection beams ISB1 to ISB4 toward the inspection area I, respectively, as first to fourth charged particle beams CPB1 to CPB4.

For example, the multi-beam generator 210b may include a single beam source BS for generating an initial beam IB as the charged particle beam CPB, a beam split structure 215 splitting the initial beam D3 into a plurality of inspection beams ISB1 to ISB4 and a plurality of guide chambers GC1 to GC4 individually guiding the inspection beams ISB1 to ISB4 to the respective deflector of the deflector group 220a.

For example, the beam source BS may generate the initial beam IB as a single charged particle beam CPB from beam source materials. As the initial beam IB may be split into the inspection beams ISB1 to ISB4, the inspection beams ISB1 to ISB4 may also be provided as the charged particle beam CPB.

In the present example embodiment, the beam source BS may be provided as a single column structure in which a beam generator for generating the charged particle beam CPB from the beam source materials and a plurality of structures for controlling the radiation of the charged particle beam CPB may be arranged along a path of the charged particle beam CPB. That is, the beam source BS may be provided as a single column structure for guiding the initial beam IB toward the beam split structure 215.

The beam split structure 215 may split the initial beam IB into a plurality of inspection beams ISB1 to ISB4 that may be provided into the respective illuminator of the illuminator group 230a.

For example, the beam split structure 215 may include a plurality of beam splitters 215a for splitting or dividing a beam into a plurality of split beams and a plurality of reflectors 215b for reflecting the split beams toward a target.

In the present example embodiment, the initial beam IB generated from the beam source BS may be split into a first split beam SB1 for inspecting the first semiconductor device C1 and a second split beam SB2 for inspecting the second semiconductor device C2. Some of the initial beam IB may be reflected from a first beam splitter BS1 to provide the first split beam SB1 and the rest of the initial beam IB may pass through the first beam splitter BS1 to provide the second split beam SB2.

The first split beam SB1 may be divided into the first inspection beam ISB1 and the second inspection beam ISB2 by a second beam splitter BS2 that may be arranged in parallel with the first beam splitter BS1. For example, some of the first split beam SB1 may be reflected from the second beam splitter BS2 into a second guide chamber GC2 as the second inspection beam ISB2. The rest of the first split beam SB1 may pass through the second beam splitter BS2 and then be reflected from a second reflector R2 into a first guide chamber GC1 as the first inspection beam ISB1.

The second split beam SB2 may pass through the first beam splitter BS1 and be reflected from a first reflector R1 that may be arranged below the first beam splitter BS1. Then, the second split beam SB2 may be divided into the third inspection beam ISB3 and the fourth inspection beam ISB4 by a third beam splitter BS3 that may be arranged in parallel with the first reflector R1. For example, some of the second split beam SB2 may be reflected from the third beam splitter BS3 into a third guide chamber GC3 as the third inspection beam ISB3. The rest of the second split beam SB2 may pass through the third beam splitter BS3 and then be reflected from a third reflector R3 into a fourth guide chamber GC4 as the fourth inspection beam ISB4.

The first inspection beam ISB1 may be deflected by the first deflector 221 and may be irradiated onto the first inspection area I11 as the first charged particle split beam CPB1 by the first illuminator 231, and the second inspection beam ISB2 may be deflected by the second deflector 222 and may be irradiated onto the second inspection area I12 as the second charged particle split beam CPB2 by the second illuminator 232. In the same way, the third inspection beam ISB3 may be deflected by the third deflector 223 and may be irradiated onto the third inspection area I21 as the third charged particle split beam CPB3 by the third illuminator 233, and the fourth inspection beam ISB4 may be deflected by the fourth deflector 224 and may be irradiated onto the fourth inspection area I22 as the fourth charged particle split beam CPB4 by the fourth illuminator 234. As the beam source BS may be provided as a single column structure for guiding the initial beam D3 toward the beam split structure 215 and the initial beam IB may be split into the first to fourth charged particle beams CPB by the beam split structure, the second modified beam scanner 200b may be configured into a single-column multi-beam structure.

The first to fourth group of the secondary electrons E1 to E4 may be generated from the first to fourth inspection areas I11, I12, I21 and I22 in response to the first to fourth charged particle beams CPB1 to CPB4, respectively, and may be individually detected independently from one another by the defect detector 500. Thus, four inspection processes may be conducted to the semiconductor device C simultaneously.

While the present example embodiment discloses that a plurality of beam splitters 215a and a plurality of reflectors 215b may be provided with the beam split structure 215, any other devices or structures may also be provided with the beam split structure 215 together with the beam splitters 215a and/or the reflectors 215b or in place of the beam splitters 215a and/or the reflectors 215b.

For example, the beam split structure 215 may include an illumination aperture APE for reflecting the initial beam IB toward a plurality of illuminators that may be arranged in series along a row or a column direction of the wafer W. Thus, a plurality of charged particle beams may be simultaneously irradiated onto a plurality of inspection areas I that may be arranged in the row or the column direction on the wafer W.

The deflector group 220a and the illuminator group 230a may have substantially the same structures as the deflector group 220a and the illuminator group 230a of the first modified scanner 200a shown in FIG. 3. Thus, any further detailed descriptions on the deflector group 220a and the illuminator group 230a of the second modified scanner 200b are omitted.

Accordingly, the second modified scanner 200b may include the beam source BS for generating the initial beam IB and the beam split structure 215 or the illumination aperture APE for splitting the initial beam IB into a plurality of charged illumination beams CPB1 to CPB4 that may be individually irradiated onto a plurality of inspection areas I11, I12, I21 and I22, respectively.

When each of the charged particle beams CPB1 to CPB4 are irradiated onto the respective inspection area I, the secondary electrons E may be generated from the respective inspection area I and may be detected by the electron detector 510 without any substantial interference among the first to fourth group of the secondary electrons E1 to E4. The defect detector 500 may generate a detection image corresponding to the inspection area I based on a detection voltage caused by the secondary electrons E.

The brightness of the detection image may vary according to the detection voltage or the quantity of the secondary electrons E. Thus, a defect in the inspection area I of the semiconductor device C may be detected by the brightness contrast between the detection image and a reference image indicating an image of the inspection area I when no defect exists in the respective inspection area I. As the brightness of the detection image may be determined by the detection voltage of the secondary electrons E, the brightness contrast between the detection image and the reference image is called a voltage contrast and the inspection process using the voltage contrast is known as a voltage contrast inspection.

The semiconductor devices C on the wafer W may include one or more CMOS devices. Each CMOS device includes a PMOS device and a NMOS device. When the charged particle beam CPB is irradiated onto the inspection area I of a semiconductor device C having a plurality of PMOS devices and NMOS devices and the voltage contrast inspection is conducted on the semiconductor device C, there are problems in that the reference image of the PMOS device may be different from that of the reference image of the NMOS device due to the characteristics of the PN junction diode. That is, the reference image for the voltage contrast cannot be uniquely determined when inspecting the CMOS device by the voltage contrast inspection. In addition, as the inspection area I for the voltage contrast inspection by using the charged particle beam CPB may have such a minute and fine size that a great number of the inspection areas I may be needed for inspecting the semiconductor devices C on the wafer W, the voltage contrast inspection requires a great deal of inspection time.

For those reasons, at least one of a high-frequency light HL and a low-frequency light LL may be irradiated onto the inspection area I of the semiconductor device C for improving the brightness of the reference image for inspecting the detection images of the NMOS devices and for reducing the whole inspection time of the voltage contrast inspection to the CMOS device.

In an example embodiment, the first and the second light sources 300 and 400 may selectively irradiate the high-frequency light HL and the low-frequency light LL to the inspection area I of the semiconductor device C including the PMOS device and the NMOS device. As illustrated in FIG. 1, the first light source 300 may be arranged, with respect to the semiconductor device C, in a slanted (e.g., angled) orientation over the semiconductor device C at a side of the beam scanner 200. The second light source 400 may be arranged with respect to the semiconductor device C, in a slanted (e.g., angled) orientation over the semiconductor device C at another side of the beam scanner 200. In the present example embodiment, the charged particle beam CPB may be irradiated in a vertical direction with respect to the semiconductor device C. In view of the orientation of the beam source BS, first light source 300, and the second light source 400 the high-frequency light HL and the low-frequency light LL may be irradiated to the CMOS device C in such a way that the illumination areas of the charged particle beam CPB, the high-frequency light HL and the low-frequency light LL may have the same illumination center.

When the high-frequency light HL is irradiated onto the inspection area I of the semiconductor device C, a potential barrier of the PN junction may be lowered in the PMOS device. Thus, the intensity of the forward current IF causes the secondary electrons E to increase, and as a result, the dwell time of the beam scanner 200 may be sufficiently reduced. For example, the same amount of the secondary electrons E may be generated from the inspection area I although the beam scanner 200 may dwell over the inspection area I for a shorter time. Thus, the illumination time of the charged particle beam CPB of the beam scanner 200 may be reduced.

Therefore, the high-frequency light HL may be used to have a sufficient optical energy for increasing the intensity of the forward current in the PMOS device. In the present example embodiment, the high-frequency light HL may have a frequency higher than that of ultraviolet rays. For example, the high-frequency light HL may include one of an alpha ray, a beta ray, a neutron ray and an X-ray.

Figure 5:
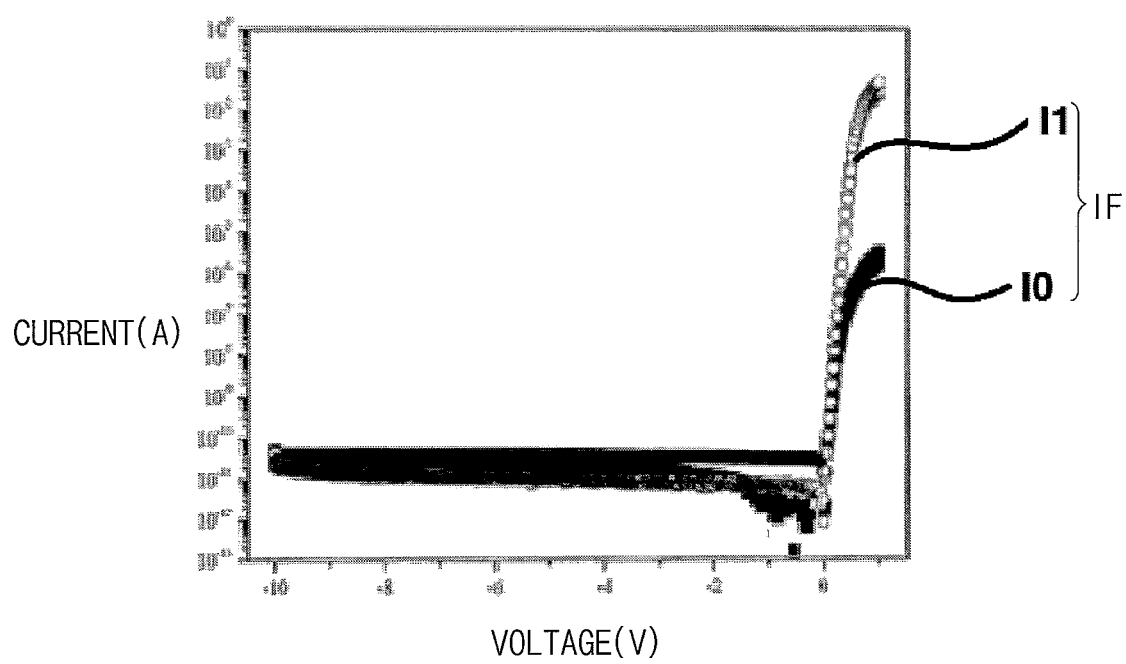
FIG. 5 is a graph showing the relationship between the current and the voltage in the forward current area of the PN junction diode when the high-frequency light is irradiated onto the PN junction diode.

FIG. 5 is a graph showing the relationship between the current and the voltage in the forward current area of the PN junction diode when the high-frequency light HL is irradiated onto the PN junction diode.

As shown in FIG. 5, when, for example, an X-ray is irradiated onto the PN junction diode, the gradient of the forward current IF with respect to the voltage rises much more than when no X-ray is irradiated onto the PN junction diode (e.g., when more than OV is applied). The forward current I1 generated when an X-ray is irradiated onto the PN junction diode may have much higher intensity than the forward current I0 when no X-ray is irradiated onto the PN junction diode at the same voltage. The irradiation of the X-ray onto the PN junction diode sufficiently reduces the potential barrier of the PN junction diode, so that the intensity of the forward current IF increases at the same voltage.

Figure 6:
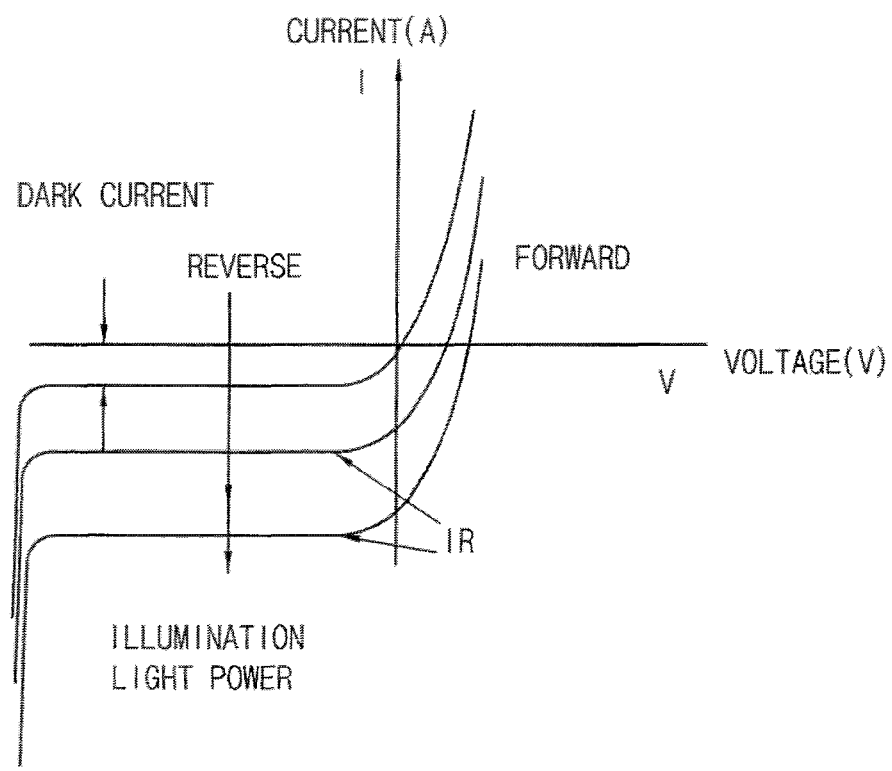
FIG. 6 is a graph showing the relationship between the current and the voltage in the reverse current area of the PN junction diode when the low-frequency light is irradiated onto the PN junction diode on condition that an energy of the low frequency light is greater than a band gap energy of the PN junction diode.

FIG. 6 is a graph showing the relationship between the current and the voltage in the reverse current area of the PN junction diode when the low-frequency light LL is irradiated onto the PN junction diode. As discussed below, when the low-frequency light LL is irradiated onto the inspection area I of the semiconductor device C and the energy of the low-frequency light LL is sufficiently greater than the band gap energy of the inspection area I, the kinetic energy of the secondary electrons E may be boosted and the brightness of the detection images may be sufficiently improved.

As shown in FIG. 6, when the low-frequency light LL having an energy greater than the band gap energy of the PN junction diode is irradiated onto the inspection area I of the semiconductor device C, the intensity of the reverse current IR may increase in the PN junction diode, and as a result, a photo electromotive force may be applied to a boundary surface of the PN junction diode. Thus, the interfacial potential of the PN junction diode may be reinforced as much as the photo electromotive force and the secondary electrons E may be accelerated by the photo electromotive force in the PN junction diode. That is, the secondary electrons E may be boosted at the boundary surface of the PN junction diode by the low-frequency light LL. Particularly, the greater the energy of the low-frequency light LL, the higher the intensity of the reverse current IR and the more the dark current on the boundary surface of the PN junction diode.

For example, the low-frequency light LL may include one of a laser-generated light, an ultraviolet ray and a visible ray.

Accordingly, when the high-frequency light HL and the low-frequency light LL are irradiated onto the inspection area I of the semiconductor device C, the secondary electrons E may behave according to the operation characteristics of the PN junction diode as described above with reference to FIGS. 5 and 6.

Figure 7:
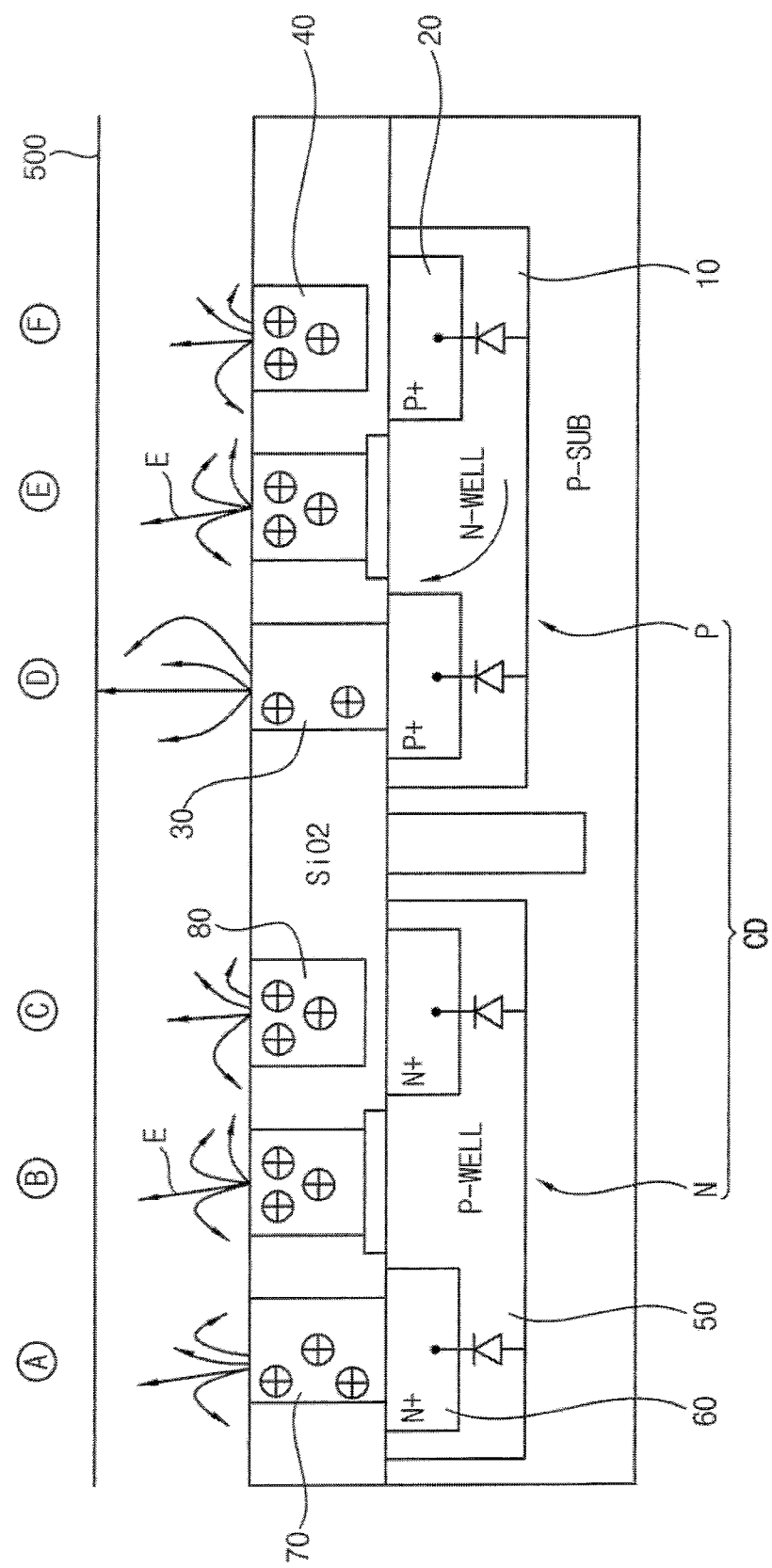
FIG. 7 is a structural view illustrating a behavior of the secondary electrons generated from the inspection area of the semiconductor device shown in FIG. 1.

FIG. 7 is a structural view illustrating a behavior of the secondary electrons generated from the inspection area of the semiconductor device C shown in FIG. 1. In FIG. 7, the semiconductor device C includes a CMOS device including a plurality of PMOS devices P and a plurality of NMOS devices N and the behaviors of the secondary electrons in the PMOS device P and the NMOS device N are simultaneously illustrated for the convenience of comparison.

Referring to FIG. 7, when the charged particle beam CPB is irradiated onto the inspection area I of the semiconductor device C including the PMOS device P, secondary electrons E are generated from the N-well 10 doped with N-type impurities and flow into a first doping area 20 doped with P-type impurities. Then, the secondary electrons E are diffused outwards through a normal PMOS contact structure 30 making contact with the first doping area 20 in the PMOS device. The diffused secondary electrons E may be detected by the defect detector 500 that may be arranged over the PMOS device P and a fourth detection image D is generated in the defect detector 500 by using the secondary electrons E.

Particularly, the N-well 10 and the first doping area 20 may function as the PN junction diode in the PMOS diode P and the secondary electrons E may behave as if a forward bias is applied to the PN junction diode. Thus, the flow of the secondary electrons E from the N-well 10 to the normal PMOS contact structure 30 via the first doping area 20 may generate a forward current in the PMOS device P.

In contrast to the normal PMOS contact structure 30, an abnormal PMOS contact structure 40 may be spaced apart from the first doping area 20 in the PMOS device P by an insulation interlayer such as a silicon oxide layer, so that the N-well 10 and the abnormal PMOS contact structure 40 may not function as a PN junction diode and no forward bias may be applied toward the abnormal PMOS contact structure 40. Thus, the flow of the secondary electrons E from the N-well 10 to the abnormal PMOS contact structure may be noticeably reduced as compared with the flow of the secondary electrons E to the normal PMOS contact structure 30.

Therefore, the quantity of the secondary electrons E that may be diffused from the abnormal PMOS contact structure 40 may be much smaller than that of the secondary electrons E that may be diffused from the normal PMOS contact structure 30. The secondary electrons E diffused from the abnormal PMOS contact structure 40 may be detected by the defect detector 500 and a sixth detection image F may be generated in the defect detector 500.

As the quantity of the secondary electrons E diffused from the normal PMOS contact structure 30 may be much greater than that of the secondary electrons E diffused from the abnormal PMOS contact structure 40, the voltage difference may be clear between the fourth detection image D and the sixth detection image F. Thus, when conducting the voltage contrast inspection with respect to the PMOS device P, the fourth detection image D may function as the reference image for the voltage contrast. That is, as the sixth detection image F may be sufficiently dark as compared with the fourth detection image D, the abnormal PMOS contact structure 40 may be detected as a defect just by the comparison of the sixth detection image F with respect to the fourth detection image D, that is, the voltage contrast of the detection image with respect to the reference image.

When the charged particle beam CPB is irradiated onto the semiconductor device C, a reverse bias may be applied between the P-well 50 and a second doping area 60 in the NMOS device N by the same charged particle beam CPB, while the forward bias may be applied between the N-well 10 and the first doping area 20 in the PMOS device P by the charged particle beam CPB.

When the charged particle beam CPB is irradiated onto the inspection area I of the semiconductor device C including the NMOS device N, secondary electrons E are generated from the P-well 50 doped with P-type impurities and flow into the second doping area 60 doped with N-type impurities. Then, the secondary electrons E are diffused outwards through a normal NMOS contact structure 70 making contact with the second doping area 60 in the NMOS device N. The diffused secondary electrons E are detected by the defect detector 500 arranged over the NMOS device N and a first detection image A is generated in the defect detector 500 by using the secondary electrons E.

Particularly, the P-well 50 and the second doping area 60 function as the PN junction diode in the NMOS diode N and the secondary electrons E behave as if a reverse bias is applied to the PN junction diode. Thus, the flow of the secondary electrons E from the P-well 50 to the normal NMOS contact structure 70 via the second doping area 60 generates a reverse current in the NMOS device N.

Therefore, the quantity of the secondary electrons E diffused from the normal NMOS contact structure 70 to which the reverse bias is applied is less than that of the secondary electrons E diffused from the normal PMOS contact structure 30 to which the forward bias is applied. Accordingly, the brightness of the first detection image A is lower than that of the fourth detection image D.

In contrast to the normal NMOS contact structure 70, an abnormal NMOS contact structure 80 is spaced apart from the second doping area 60 in the NMOS device N by an insulation interlayer such as a silicon oxide layer. Thus, the flow of the secondary electrons E from the P-well 50 to the abnormal NMOS contact structure 80 is noticeably reduced as compared with the flow of the secondary electrons E to the normal NMOS contact structure 70.

Therefore, the quantity of the secondary electrons E that is diffused from the abnormal NMOS contact structure 80 is much smaller than that of the secondary electrons E that is diffused from the normal NMOS contact structure 70. The secondary electrons E diffused from the abnormal NMOS contact structure 80 is detected by the defect detector 500 and a third detection image C is generated in the defect detector 500. The third detection image C may have substantially the same brightness as the sixth detection image F. Terms such as "same" or "equal" as used herein encompass identicality or near identicality including variations that may occur, for example, due to manufacturing processes. The term "substantially" may be used herein to emphasize this meaning, unless the context or other statements indicate otherwise.

Although the normal PMOS contact structure 30 and the normal NMOS contact structure 70 may sufficiently make contact with the first doping area 20 and the second doping area 60, respectively, the brightness of the first detection image A may be lower than that of the fourth detection image D and thus it is possible that the first detection image A may be identified as the defect image. Thus, when the same charged particle beams CPB are irradiated onto the PMOS device P and the NMOS device N, the defect of the NMOS device may be difficult to find by the voltage contrast inspection.

FIG. 8 is a table showing the detection images of the inspection areas of the semiconductor device shown in FIG. 7. In FIG. 8, the detection images were generated by the defect detector 500 in a normal mode and three boosting modes in which the secondary electrons E are boosted by the high-frequency light HL and/or the low-frequency light LL.

Referring to FIG. 8, when the voltage inspection process is conducted in the normal mode in which no high-frequency light HL and no low-frequency light LL are irradiated onto the inspection areas I, and thus the secondary electrons E are not boosted, the fourth detection image D is sufficiently contrasted with the sixth detection image F, while the first detection image AD is not sufficiently contrasted with the third detection image C based on a brightness contrast.

Thus, the first detection image indicating the normal NMOS contact structure 70 cannot function as a reference image for determining the third detection image C indicating the abnormal NMOS contact structure 80 as a defect image.

That is, in the normal mode of the voltage contrast inspection, the fourth detection image may function as the reference image for determining the sixth detection image as the defect image in the PMOS device P, while the first detection image may not function as the reference image for determining the third detection image as the defect image in the NMOS device N.

In such a case, the low-frequency light LL is irradiated onto the inspection area I and the secondary electrons E generated from the P-well 50 of the NMOS device N is boosted to thereby improve the brightness of the first detection image A as shown in boosting mode 1 in FIG. 8.

In boosting mode 1 of the voltage contrast inspection, the brightness of the first detection image A may come close to that of the fourth detection image D, so that the first detection image A can be sufficiently contrasted with the third detection image C based on brightness contrast.

The graph in FIG. 6 shows that the forward current IF may be sensitive to the applied voltage in the PN junction diode while the reverse current IR may be constant until a threshold voltage is applied to the PN junction diode. Therefore, the reverse bias may be much more sensitive to the photo electromotive force rather than the forward bias in the PN junction when the low-frequency light LL is irradiated onto the semiconductor device C.

Thus, the reverse current IR may increase in response to the photo electromotive force at the boundary surface between the P-well 50 and the second doping area 60, so that the secondary electrons E generated from the P-well 50 are boosted or accelerated toward the second doping area 60. Therefore, the voltage of the detected secondary electrons E is increased and the brightness of the first detection image A may be sufficiently increased by the low-frequency light LL.

Accordingly, the first detection image A indicating the normal NMOS contact structure 70 may function as the reference image for determining the third detection image C indicating the abnormal NMOS contact structure 80 as the defect image in boosting mode 1 of the voltage contrast inspection.

However, the detection current of the secondary electrons E may have substantially the same intensity as that of the secondary electrons E in the normal mode. As the potential barrier of the PN junction may be unchanged by the low-frequency light LL, the intensity of the detection current caused by the secondary electrons E may also be unchanged in boosting mode 1.

That is, the quantity of the secondary electrons E detected by the defect detector 500 in the normal mode may be the same as that in boosting mode 1. Thus, the detection of a minimal quantity of the secondary electrons E for generating the detection image may require substantially the same time (which is referred to as dwell time) in both of the normal mode and boosting mode 1. That is, the dwell time of the defect detector 500 cannot be improved by irradiating the low-frequency light LL onto the semiconductor device C.

In boosting mode 2 of the voltage contrast inspection, the high-frequency light HL is irradiated onto the inspection area I of the semiconductor device C together with the charged particle beam CPB and the potential barrier is reduced in the boundary surface of the PN junction. Thus, the intensity of the detection current may increase at the same applied voltage and the quantity of the secondary electrons E detected by the defect detector 500 may increase without increasing the applied voltage.

Accordingly, the minimal quantity of the secondary electrons E for generating the detection image is obtained in a shorter time and the dwell time of the defect detector 500 is reduced by the irradiation of the high-frequency light HL. That is, the dwell time of the defect detector 500 in the boosting mode 2 is sufficiently shorter than that of the defect detector 500 in normal mode.

However, the first detection image A may not be sufficiently contrasted with the third detection image C yet because the low-frequency light LL is not irradiated onto the semiconductor device C. Thus, the first detection image A cannot function as the reference image for determining the third image C as the defect image in the voltage contrast inspection.

Thus, both of the high-frequency light HL and the low-frequency light LL are irradiated onto the semiconductor device C for improving the brightness of the first image A and shortening the dwell time of the defect detector 500 (boosting mode 3).

Figure 9:
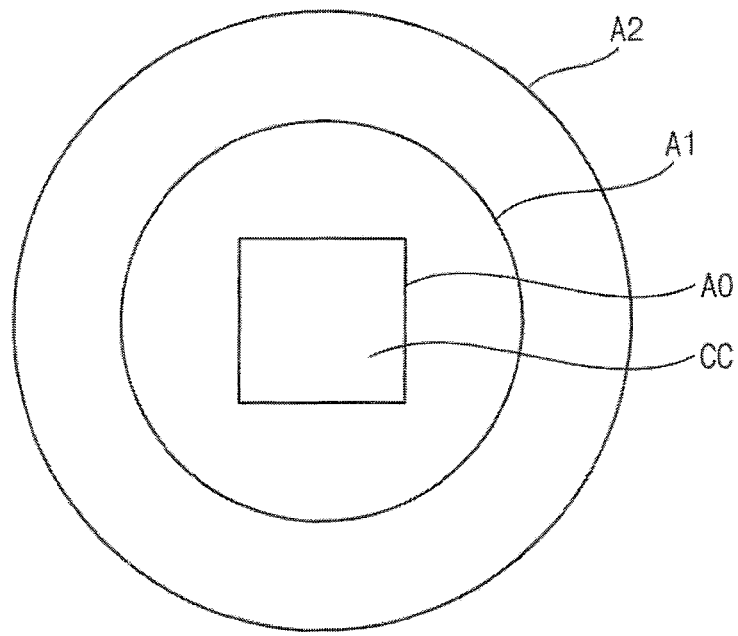
FIG. 9 is a plan view illustrating irradiation areas of the charged particle beam, the high-frequency light and the low-frequency light in accordance with an example embodiment of the present inventive concept.
Figure 10:
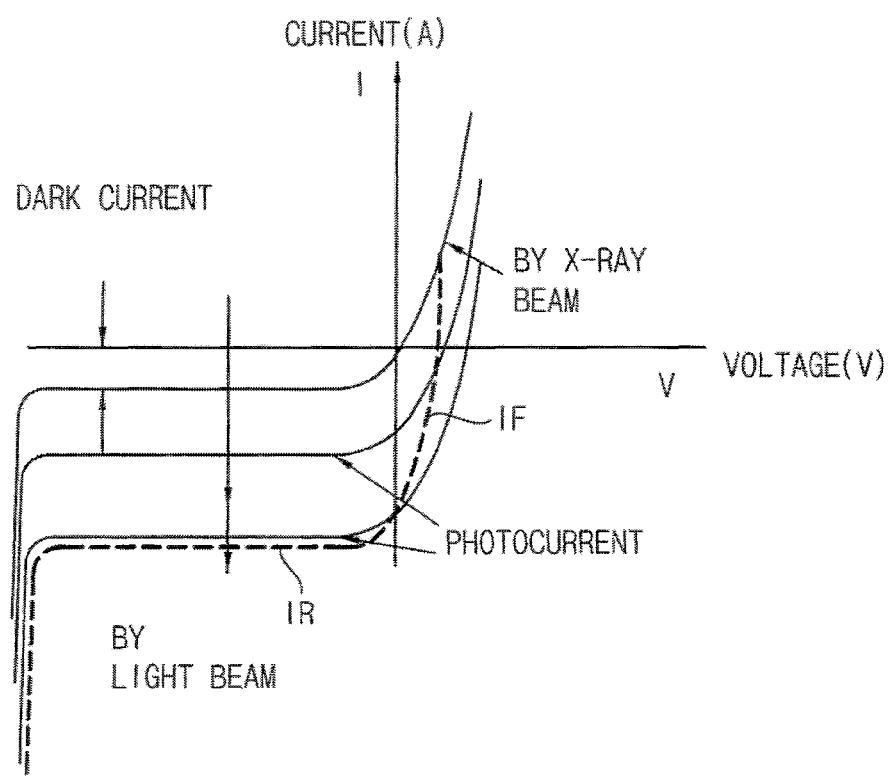
FIG. 10 is a graph showing the relationship between the current and the voltage of the PN junction diode when the high-frequency light and the low-frequency light are simultaneously irradiated to the PN junction diode.

FIG. 9 is a view illustrating irradiation areas of the charged particle beam CPB, the high-frequency light HL and the low-frequency light LL in accordance with an example embodiment of the present inventive concept and FIG. 10 is a graph showing the relationship between the current and the voltage of the PN junction diode when the high-frequency light HL and the low-frequency light LL are simultaneously irradiated onto the PN junction diode.

Referring to FIG. 9, the charged particle beam CPB, the high-frequency light HL and the low-frequency light LL are irradiated onto the inspection area I of the semiconductor device C in such a way that the charged particle beam CPB, the high-frequency light HL and the low-frequency light LL may be radially irradiated at a common irradiation center CC, so that the charged particle beam CPB, the high-frequency light HL and the low-frequency light LL may have the same focal point.

Accordingly, although the charged particle beam CPB, the high-frequency light HL and the low-frequency light LL may be located at different positions with different installation angles, the irradiation area of the charged particle beam CPB, the high-frequency light HL and the low-frequency light LL may be partially interposed around the common irradiation center CC.

In the present example embodiment, a second irradiation area A2 to which the low-frequency light LL may be irradiated may be larger than a first irradiation area A1 to which the high-frequency light HL may be irradiated. In addition, the first irradiation area A1 may be larger than a beam area A0 to which the charged particle beam CPB may be irradiated. Thus, the secondary electrons E generated from the beam area A0 may be sufficiently exposed to the high-frequency light HL and the low-frequency light LL.

As shown in FIG. 10, when the high-frequency light HL is irradiated onto the semiconductor device C, the potential barrier of the PN junction is reduced in the semiconductor device C and the intensity of the forward current IF may increase at the same applied voltage. Further, when the low-frequency light LL is irradiated onto the semiconductor device C, the secondary electrons E may be boosted or accelerated in the NMOS device N by the photo electromotive force.

Thus, a sufficient quantity of the secondary electrons E may be detected by the defect detector 500 for shorter time across the semiconductor device C and the kinetic energy of the secondary electrons E may be boosted by the photo electromotive force in the NMOS device N.

Accordingly, the dwell time of the defect detector 500 may be reduced and the first detection image A may be sufficiently contrasted with the third detection image C. That is, the third detection image C may be accurately and rapidly detected as the defect image by the voltage contrast with the first detection image A, so that the defect in the abnormal NMOS contact structure 70 may be accurately and rapidly detected by the voltage contrast inspection.

Particularly, the secondary electrons E may be sufficiently detected by the defect detector 500 in a shorter time and a sufficiently high quality of the detection images may be obtained in spite of the shorter dwell time. Thus, an overall inspection time of the voltage contrast inspection may be remarkably improved by the high-frequency light HL.

The defect detector 500 may be arranged over the semiconductor device C and may detect the secondary electrons E from the semiconductor device C. A plurality of detection images may be generated from the inspection areas I of the semiconductor device C, respectively.

For example, as illustrated in FIG. 1, the defect detector 500 may include an electron detector 510 for detecting the secondary electrons E and generating analogue detect signals in accordance with energy spectrums and the quantity of the secondary electrons E, an image generator 520 for generating the detection images according to the detection signals by a unit of the inspection area I and a defect image detector 530 for conducting the voltage contrast between each detection image and a reference image based on a preset defect criterion and detecting the detection image satisfying the defect criterion as a defect image. The defect detector 500, electron detector 510, image generator 520, and defect image detector 530 may be implement by electronic (or optical) circuits such as logic circuits, discrete components, microprocessors, hard-wired circuits, memory elements, wiring connections, and the like, which may be formed using semiconductor-based fabrication techniques or other manufacturing technologies. The microprocessors or similar may be programmed using software (e.g., microcode) to perform various functions discussed herein and may optionally be driven by firmware and/or software that may be stored in a memory device. Alternatively, the defect detector 500, electron detector 510, image generator 520, and defect image detector 530 may be implemented by dedicated hardware, or as a combination of dedicated hardware to perform some functions and a processor (e.g., one or more programmed microprocessors and associated circuitry) to perform other functions.

For example, the electron detector 510 may include an electron capture structure that may be around the illuminator 230 over the semiconductor device C. Thus, the secondary electrons E generated from the inspection area I in response to the charged particle beam CPB may be diffused upwards and may be detected by the electron detector 510. The electron detector 510 may have a sufficiently large detection surface facing the semiconductor device C. In the present example embodiment, the electron detector 510 may be arranged at a lower portion of the beam scanner 200 around the illuminator 230.

The electron detector 510 may generate an analog signal according to electrical characteristics of the secondary electrons E as the detection signal. Thus, the detection signal may have various signal characteristics based on the quantity and the kinetic energy of the detected secondary electrons E. The characteristics of the detection signal may also be varied according to the secondary electros E detected from the PMOS device P or from the NMOS device N.

While the present example embodiment discloses that the electron detector 510 may be arranged around the illuminator 230, the electron detector 510 may be located at various positions and may have various configurations according to the behaviors of the secondary electrons E and the structures of the beam scanner 200 as long as the secondary electrons E may be sufficiently well detected.

The image generator 520 may generate the detection image having brightness corresponding to the voltage of the detection signal. For example, the image generator 520 may include an amplifier 521 for amplifying the detection signal and an analog-digital converter (ADC) 522 for converting the analog detection signal to a digital signal. The detection image may be generated by a unit of the inspection area I and may be stored in a storing unit 523 as a digital data.

Particularly, at least a reference image may also be stored in the storing unit 523 and the detection image may be contrasted with the reference image. The reference image may include a PMOS reference image for a voltage contrast with the detection images detected from the inspection areas I of the PMOS device P (PMOS detection image) and an NMOS reference image for a voltage contrast with the detection images detected from the inspection areas I of the NMOS device N (NMOS detection image). In the present example embodiment, the brightness of the NMOS reference image may be controlled to be in a range of about 80% to about 100% of the brightness of the PMOS reference image. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The defect image detector 530 may conduct an image contrast between each detection image and the reference image based on a preset defect criterion and detect the detection image satisfying the defect criterion as a defect image. The detected defect image and the position of the inspection area I of the defect image may be stored in the defect image detector 530 as defect information. The defect image may indicate a defect that may be located in the semiconductor device C at the inspection area I.

For example, the PMOS detection images may be contrasted with the PMOS reference image and the NMOS detection images may be contrasted with the NMOS reference image. In the present example embodiment, the defect criterion may be set in such a way that the brightness of the detection image may be in a range of about 5% to about 50% of the brightness of the reference image. The defect criterion may be varied according to an inspection accuracy and the characteristics of the detection image and the reference image.

The defect detector 500 may further include a map generator 540 for generating a defect map in which a plurality of defect images may be visibly displayed at the position of the inspection area I corresponding to the defect image. For example, a base image may be generated and a plurality of semiconductor devices C and a plurality of inspection areas I of each semiconductor device C may be defined in the base image in the map generator 540. Each defect image may be marked by using a color or a shadow at the corresponding inspection area I on the base map, and the distribution of the defect images on the base map may be provided as the defect map. The defect map may be shown on a display device D or may be printed as a map book.

Figure 11:
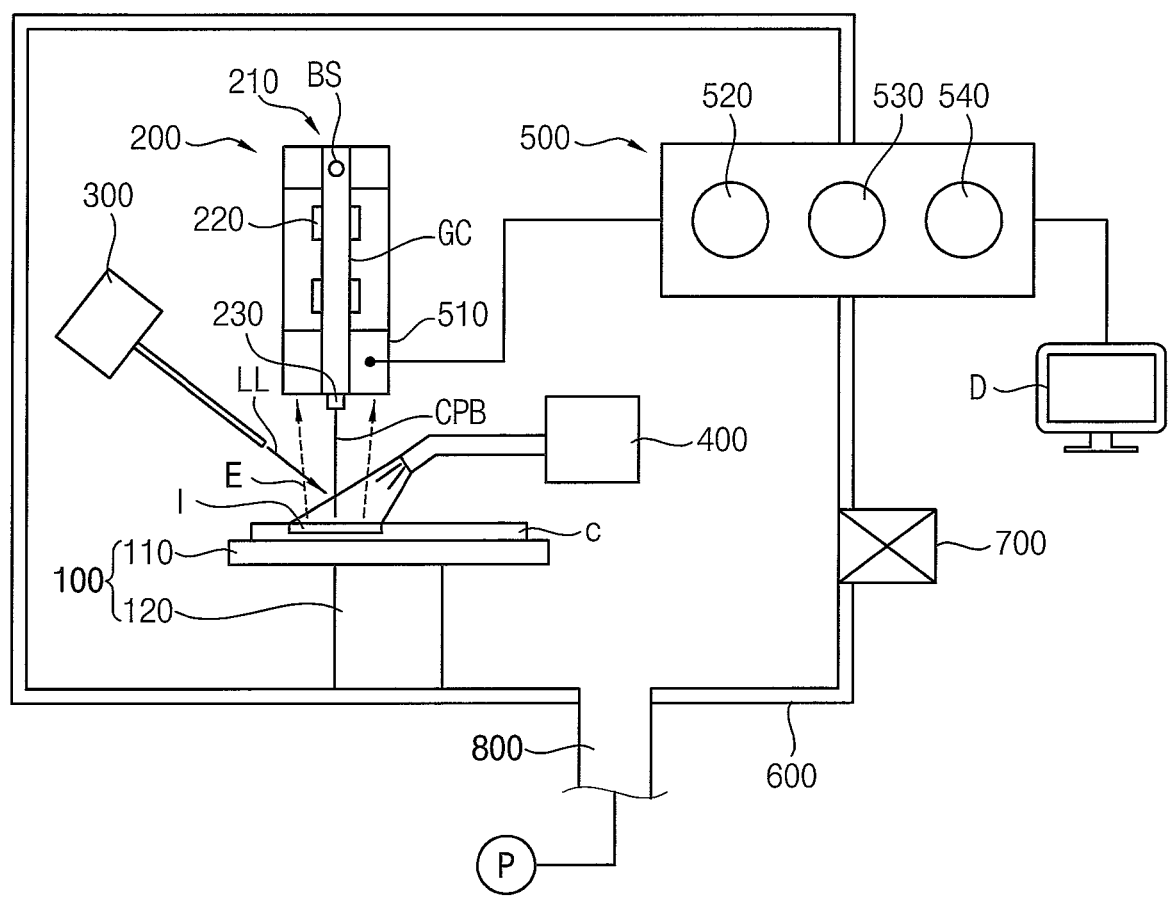
FIG. 11 is a structural view illustrating a modified inspection apparatus for inspecting semiconductor devices by using a charged particle beam in accordance with another example embodiment of the present inventive concept.

FIG. 11 is a structural view illustrating a modified inspection apparatus for inspecting semiconductor devices by using a charged particle beam in accordance with another example embodiment of the present inventive concept. In FIG. 11, the modified inspection apparatus 1001 may have the same structures as the inspection apparatus 1000 shown in FIG. 1, except that the voltage contrast inspection may be conducted under a vacuum state. Thus, in FIG. 11, the same reference numerals denote the same elements of FIG. 1 and any further detailed descriptions on the same elements will be omitted hereinafter.

Referring to FIG. 11, the modified inspection apparatus 1001 may include a vacuum chamber 600, a beam scanner 200 arranged in the vacuum chamber 600 and irradiating a charged particle beam CPB onto the semiconductor device C by an inspection area I such that secondary electrons E may be generated from the inspection area in response to the charged particle beam CPB, a first light source 300 arranged at a side of the beam scanner 200 in a slanted orientation with respect to the inspection area I and irradiating a high-frequency light HL to the inspection area I, a second light source 400 arranged at another side of the beam scanner 200 in a slanted orientation with respect to the inspection area I and irradiating a low-frequency light LL to the inspection area I, and a defect detector 500 detecting the secondary electrons E to generate a detection image indicating a defect of the semiconductor device C.

For example, the vacuum chamber 600 may include a 3-dimensional structure having a closed space that may be closed from a surrounding environment and in which the inspection process may be conducted to the semiconductor device C. The stage 100 may be provided at a bottom of the vacuum chamber 600 and the semiconductor device C may be mounted onto the stage 100. Thus, the semiconductor device C may be secured to the stage 100 in the vacuum chamber 600. The semiconductor device C, for example, may include a semiconductor chip on a wafer W. The wafer W may be arranged on the stage 100 and a plurality of semiconductor devices C may be arranged on the wafer W. In the present example embodiment, the semiconductor device C may include a CMOS device having a plurality of PMOS device P and a plurality of NMOS device N.

A gate 700 for loading/unloading the semiconductor device C may be provided at a side of the vacuum chamber 600 and a vacuum generator 800 may be provided at a bottom of the vacuum chamber 600. The gate 700 may include a valve structure having a sealing performance and the vacuum generator 800 may include a vacuum pump and a vacuum line connected to vacuum chamber 600.

When the inspection process is initiated, the gate 700 is opened and the inner space of the vacuum chamber 600 may be exposed to the outside. Then, the semiconductor device C may be loaded onto the stage 100 through the gate 700 and the gate 700 may be closed in such a way that the inner space of the vacuum chamber 600 may be closed from a surrounding environment. Thereafter, the inner space of the vacuum chamber 600 may be placed into a vacuum state by the vacuum generator 800. Therefore, the voltage contrast inspection process may be conducted under the vacuum state to thereby prevent external interference to the secondary electrons E generated during the inspection process.

As an alternative to the vacuum state, the vacuum chamber 600 may be replaced with a room pressure chamber of which the inner space may be under an atmospheric pressure.

The beam scanner 200, the first light source 300, the second light source 400 and the defect detector 500 may have substantially the same structures as the beam scanner 200, the first light source 300, the second light source 400 and the defect detector 500 of the inspection apparatus 1000 shown in FIG. 1.

Figure 12:
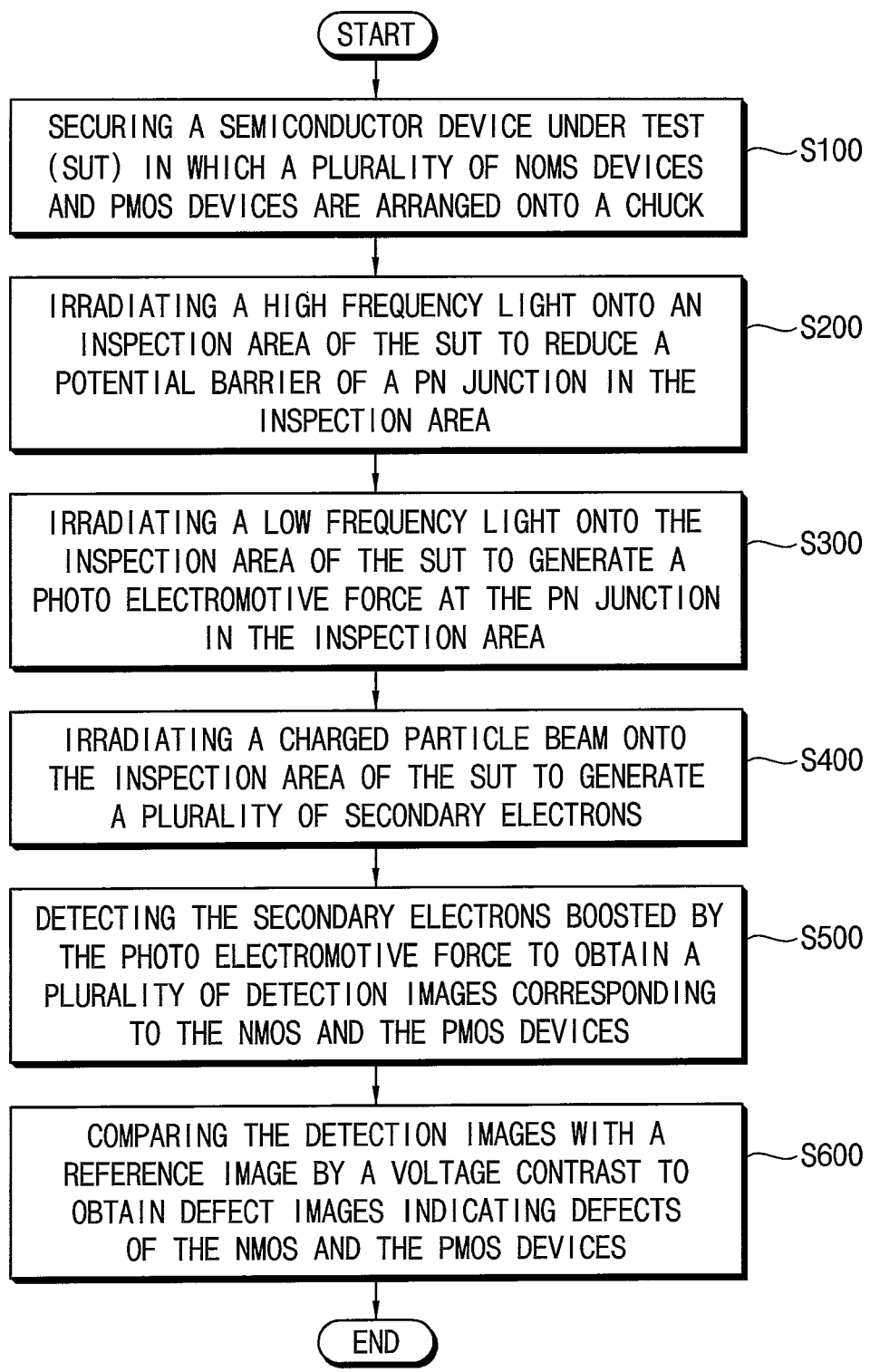
FIG. 12 is a flow chart showing a method of inspecting a semiconductor device by using a voltage contrast in the inspection apparatus shown in FIG. 1.

FIG. 12 is a flow chart showing a method of inspecting a semiconductor device by using a voltage contrast in the inspection apparatus shown in FIG. 1.

Referring to FIGS. 1 and 12, the semiconductor device C may be loaded onto the stage 100 and may be secured to the stage 100 (step S100).

The semiconductor device C may include various structures according to the step of the semiconductor manufacturing processes, so that the semiconductor device C may include an in-process device to which a unit manufacturing process may be conducted. For example, the semiconductor device may include the in-process device of a DRAM device, a flash memory device and a logic device. Particularly, the semiconductor device C may include a CMOS device in which a plurality of NMOS devices and a plurality of PMOS devices may be arranged.

Then, the high-frequency light HL may be irradiated to the inspection areas I of the semiconductor device C to reduce the potential barrier of the PN junction in the semiconductor device C (step S200).

The semiconductor device C may include the PN junction between the well area and the doping area and the high-frequency light HL may reduce the potential barrier at the boundary surface of the PN junction. Thus, more secondary electrons E may flow toward the contact structure for a unit time and the defect detector 500 may detect more secondary electrons E for the same time. That is, the defect detector 500 may detect the minimal secondary electrons E for generating the detection image for a shorter time, to thereby sufficiently reduce the dwell time of the defect detector 500.

Then, the low-frequency light LL may be irradiated onto the inspection areas I of the semiconductor device C to generate the photo electromotive force at the PN junction of the semiconductor device C (step S300).

When the low-frequency light LL having energy greater than the band gap energy of the PN junction diode is irradiated onto the inspection area I, the intensity of the reverse current IR may increase in the PN junction diode, and a photo electromotive force may be applied to the boundary surface of the PN junction diode. Thus, the interfacial potential of the PN junction diode may be reinforced as much as the photo electromotive force and the secondary electrons E may be accelerated by the photo electromotive force in the PN junction diode. Thus, the kinetic energy of the secondary electrons E may be boosted at the boundary surface of the PN junction diode by the low-frequency light LL.

Particularly, when the charged particle beam CPB is irradiated onto the CMOS device, the secondary electrons E may be under a forward bias in the PMOS device P and under a reverse bias in the NMOS device N. As the forward current IF may be sensitive to the applied voltage in the PN junction of the PMOS device P and the reverse current IR may be constant until a threshold voltage is applied to the PN junction of the PMOS device P, the photo electromotive force may have much more effect on the reverse bias rather than on the forward bias when the low-frequency light LL is irradiated onto the CMOS device. Thus, the secondary electrons E in the NMOS device N may be accelerated by the low-frequency light LL while no substantial acceleration or boosting may occur to the secondary electrons E in the PMOS device P.

Then, the charged particle beams CPB may be irradiated onto the semiconductor device C, to thereby generate a plurality of secondary electrons E from the semiconductor device C (step S400).

When the charged particle beam CPB is irradiated onto the semiconductor device C, the secondary electrons E may be generated from the well region of the semiconductor device C in response to the charged particle beam CPB. The secondary electrons E may flow into the normal or abnormal contact structures 30, 40, 70, 80 and may be diffused outwards.

Particularly, as the potential barrier of the PN junction may be reduced by the high-frequency light HL and the reverse bias may be reinforced at the boundary surface of the PN junction of the NMOS device N by the photo electromotive force caused by the low-frequency light LL, a larger quantity of the secondary electrons E may flow into the contact structures 30, 40, 70, 80 and the secondary electrons E generated from the NMOS device N may be sufficiently boosted.

Then, the boosted secondary electrons E may be detected by the defect detector 500 that may be arranged over the semiconductor device C and a plurality of detection images may be generated at every inspection area I of the semiconductor device C (step S500).

When the secondary electrons E are detected by the electron detector 510, a detection voltage and a detection current may be measured and the detection image may have different brightness shown as a color or a shadow according to the detection voltage. As the potential barrier may be reduced by the high-frequency light HL and a larger quantity of the secondary electrons E may diffuse outwards from the contact structures 30, 40, 70 and 80, the time for detecting a minimal quantity of the secondary electrons E for generating the detection image may also be reduced by the high-frequency light HL. That is, the dwell time of the defect detector 500 may be sufficiently reduced by the high-frequency light HL, thereby decreasing the inspection time of the inspection process.

In addition, the quantity of the diffused secondary electrons E in the NMOS device N may be smaller than in the PMOS device P because the reverse bias and the forward bias may be applied to the PN junction of the NMOS device N and the PMOS device P, respectively, when the charged particle beam CPB is irradiated onto the CMOS device. However, as the kinetic energy of the secondary electrons E diffused from the normal contact structure 70 in the NMOS device N may be boosted by the low-frequency light LL having energy greater than the band gap energy of the PN junction diode, the brightness of the detection image corresponding to the normal contact structure 70 may be sufficiently improved in spite of the reverse bias in the NMOS device N. Thus, the detection images corresponding to the normal contact structures 30 and 70 may be function as the reference images for the voltage contrast inspection regardless of the NMOS device N and the PMOS device P.

Accordingly, the detection image corresponding to the normal contact structure 70 may sufficiently function as the NMOS reference image and the contrast accuracy of the NMOS detection image with the NMOS reference image may be considerably improved.

The voltage contrast may be conducted with respect to the detection images corresponding to each of the inspection areas I with the reference image on a basis of the defect criterion to thereby detect the defect image satisfying the defect criterion among the detection images (step S600).

The PMOS detection images generated from the PMOS device P may be contrasted with the PMOS reference image by the voltage contrast inspection and the PMOS detection images satisfying the defect criterion may be detected as the PMOS defect images. The PMOS defect images and the positions of the inspection areas I corresponding to the PMOS defect images may be stored in the storing unit of the defect image detector 530.

The NMOS detection images generated from the NMOS device N may be contrasted with the NMOS reference image by the voltage contrast inspection and the NMOS detection images satisfying the defect criterion may be detected as the NMOS defect images. The NMOS defect images and the positions of the inspection areas I corresponding to the NMOS defect images may be stored in the storing unit of the defect image detector 530.

Accordingly, the defect of the CMOS device may be detected by the voltage contrast inspection in which a single charged particle beam CPB, a high-frequency light HL and a low-frequency light LL are irradiated onto the CMOS device regardless of the NMOS device N and the PMOS device P with sufficiently high accuracy and efficiency.

According to the example embodiments of the present inventive concept, the high-frequency light HL may be irradiated onto the semiconductor device for reducing the potential barrier of the PN junction and the low-frequency light LL may be irradiated onto the semiconductor device C for generating the photo electromotive force in the PN junction. Subsequently, when the charged particle beam CPB is irradiated onto the semiconductor device C and the secondary electrons E are generated from the well region of the semiconductor device C, a larger quantity of the secondary electrons E having a boosted energy may be detected by the defect detector 500.

The detection images may be generated from the boosted secondary electrons E for a shorter dwell time of the defect detector 500 with sufficiently high contrast. Thus, the defect of the CMOS device may be detected by the voltage contrast inspection regardless of the NMOS device N and the PMOS device P with sufficiently high accuracy and efficiency. Due to the dwell time reduction of the defect detector 500 and high voltage contrast of the detection images, the inspection process with respect to a whole surface of the wafer can be conducted with high accuracy.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An inspection apparatus for inspecting semiconductor devices, comprising:
    a stage configured to support a semiconductor device, the semiconductor device including a plurality of PMOS devices and a plurality of NMOS devices;
    a first light source configured to irradiate a high-frequency light onto an inspection area of the semiconductor device to reduce a potential barrier of a PN junction in the semiconductor device;
    a beam scanner arranged over the semiconductor device and configured to irradiate a charged particle beam onto the inspection area of the semiconductor device such that secondary electrons are generated from the inspection area in response to the charged particle beam; and
    a defect detector configured to generate a detection image corresponding to the inspection area in response to a voltage of the secondary electrons and to detect, based on a voltage contrast between a reference image and a plurality of detection images, a defect image indicating a defect in the semiconductor device from among the plurality of detection images.

2. The inspection apparatus of claim 1, configured such that the charged particle beam is irradiated onto a first area of the inspection area, and the high-frequency light is irradiated onto a second area of the inspection area, wherein the second area is larger than the first area and the second area and the first area have a common center point.

3. The inspection apparatus of claim 2, further comprising a second light source configured to irradiate a low-frequency light having energy greater than a band gap energy of the inspection area onto the inspection area to generate a photo electromotive force such that the secondary electrons are boosted by the photo electromotive force.

4. The inspection apparatus of claim 3, configured such that the low-frequency light is irradiated onto a third area of the inspection area larger than the second area, wherein the third area and the second area have a common center point.

5. The inspection apparatus of claim 3, configured such that the high-frequency light includes one of an alpha ray, a beta ray, a neutron ray and an X ray and the low-frequency light includes one of laser-generated light, an ultraviolet ray and a visible ray.

6. The inspection apparatus of claim 3, wherein the defect detector includes:
an electron detector arranged over the semiconductor device and configured to detect the secondary electrons by a unit of the inspection area and generating analog detection signals in accordance with a detected quantity of the secondary electrons;
an image generator connected to the electron detector and configured to generate a plurality of detection images according to the analog detection signals, the plurality of detection images including a first subset of detection images corresponding to the PMOS devices and a second subset of detection images corresponding to the NMOS devices; and
a defect image detector configured to conduct the voltage contrast between each of the plurality of detection images and a reference image based on a preset defect criterion and detecting the detection image satisfying the defect criterion as a defect image.

7. The inspection apparatus of claim 6, wherein each analog detection signal has a detection voltage that is varied by the detected secondary electrons and the detection image has a brightness visibly expressed by one of a color and a shadow according to the detection voltage.

8. The inspection apparatus of claim 7, wherein the reference image includes a PMOS reference image with which the first subset of detection images are contrasted and a NMOS reference image with which the second subset of detection images are contrasted.

9. The inspection apparatus of claim 8, wherein a brightness of the NMOS reference image is in a range of 80% to 100% of a brightness of the PMOS reference image and the defect image is detected as the defect criterion on condition that a brightness of the detect image is in a range of about 5% to about 50% of a brightness of the reference image.

10. The inspection apparatus of claim 6, wherein the defect detector further includes a map generator configured to generate a defect map in which the defect image and a position of the inspection area corresponding to the defect image are visibly displayed on a base map on which a plurality of semiconductor devices and a plurality of inspection areas are defined.

11. The inspection apparatus of claim 1, wherein the beam scanner includes:
a beam generator including a beam source configured to generate the charged particle beam and a guide chamber through which the charged particle beam is guided toward the inspection area of the semiconductor device from the beam source;
a deflector arranged on a side of the guide chamber and configured to control a path of the charged particle beam toward the inspection area of the semiconductor device; and
an illuminator arranged at an end portion of the guide chamber and configured to focus the charged particle beam onto the inspection area of the semiconductor device.

12. The inspection apparatus of claim 11, wherein a plurality of beam scanners are arranged over the semiconductor device in such a configuration that a plurality of the illuminators are positioned over a plurality of inspection areas of the semiconductor device, respectively, and a plurality of charged particle beams are simultaneously irradiated onto the respective inspection areas independently from one another.

13. The inspection apparatus of claim 1, wherein the beam scanner includes:
a multi-beam generator configured to generate a single initial beam as the charged particle beam and splitting the initial beam into a plurality of inspection beams;
a plurality of deflectors configured to individually control a path of each of the plurality of inspection beams toward a plurality of inspection areas of the semiconductor device, respectively; and
a plurality of illuminators arranged at an end portion of the multi-beam generator and configured to individually focus each of the plurality of inspection beams onto the respective inspection areas, respectively, as a plurality of charged particle split beams.

14. The inspection apparatus of claim 13, wherein the multi-beam generator includes:
a single beam source configured to generate the initial beam;
a beam split structure configured to split the initial beam into the plurality of inspection beams; and
a plurality of guide chambers configured to individually guide each of the plurality of inspection beams toward the respective inspection areas of the semiconductor device.

15. The inspection apparatus of claim 14, wherein at least one of the plurality of deflectors is arranged on a side of the respective guide chamber and one of the plurality of illuminators is arranged at an end portion of the respective guide chamber such that a plurality of charged particle split beams are simultaneously irradiated onto the plurality of inspection areas.

16. The inspection apparatus of claim 14, wherein the beam split structure includes a plurality of beam splitters for splitting the initial beam into a plurality of split beams and a plurality of reflectors for reflecting the split beams toward the respective guide chambers as the plurality of inspection beams.

* * * * *